(12) United States Patent
Gottsmann et al.

(10) Patent No.: US 11,618,950 B2
(45) Date of Patent: Apr. 4, 2023

(54) COATING PROCESSES FOR VACUUM CHAMBER ARRANGEMENTS AND APPARATUS THEREOF

(71) Applicant: VON ARDENNE Asset GmbH & Co. KG, Dresden (DE)

(72) Inventors: Lutz Gottsmann, Grossroehrsdorf (DE); Georg Laimer, Meissen (DE); Jens Melcher, Dresden (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 253 days.

(21) Appl. No.: 17/209,259

(22) Filed: Mar. 23, 2021

(65) Prior Publication Data

US 2021/0207267 A1 Jul. 8, 2021

Related U.S. Application Data

(62) Division of application No. 15/956,834, filed on Apr. 19, 2018, now abandoned.

(30) Foreign Application Priority Data

| Apr. 26, 2017 | (DE) | 10 2017 108 962 |
| May 8, 2017 | (DE) | 10 2017 109 820 |

(51) Int. Cl.
*C23C 16/458* (2006.01)
*C23C 16/54* (2006.01)
(Continued)

(52) U.S. Cl.
CPC .......... *C23C 16/4586* (2013.01); *C23C 14/30* (2013.01); *C23C 14/50* (2013.01);
(Continued)

(58) Field of Classification Search
CPC ....... C23C 14/30; C23C 14/50; C23C 14/566; C23C 14/54
See application file for complete search history.

(56) References Cited

U.S. PATENT DOCUMENTS

| 3,656,454 A | * | 4/1972 | Schrader | C23C 14/566 |
| | | | | 414/217 |
| 4,002,141 A | * | 1/1977 | Shrader | C23C 14/505 |
| | | | | 118/730 |

(Continued)

FOREIGN PATENT DOCUMENTS

| DE | 19743800 C1 | * | 2/1999 | ........... C23C 14/541 |
| DE | 19850415 C1 | * | 2/2000 | ............. C23C 14/50 |

*Primary Examiner* — Charlee J. C. Bennett
(74) *Attorney, Agent, or Firm* — Viering, Jentschura & Partner mbB

(57) ABSTRACT

Coating processes for vacuum chamber arrangements and apparatus thereof are herein disclosed. In some aspects, a coating process may include coating at least one workpiece using a vacuum chamber arrangement. The vacuum chamber arrangement may include a vacuum chamber, a substrate holding arrangement, an additional substrate holding arrangement, one or more bearings, a supply hose and an additional supply hose. The vacuum chamber may include a lock chamber, an additional lock chamber, a heating chamber, an additional heating chamber, and a coating chamber. The one or more bearings may support the substrate holding arrangement in such a way that it can be moved between the lock chamber and the coating chamber. The one or more bearings may also support the additional substrate holding arrangement in such a way that it can be moved between the additional lock chamber and the coating chamber.

20 Claims, 7 Drawing Sheets

(51) Int. Cl.
*H01L 21/677* (2006.01)
*C23C 14/56* (2006.01)
*C23C 14/50* (2006.01)
*C23C 14/30* (2006.01)

(52) U.S. Cl.
CPC ............ *C23C 14/566* (2013.01); *C23C 16/54* (2013.01); *H01L 21/677* (2013.01)

(56) References Cited

U.S. PATENT DOCUMENTS

| | | | | |
|---|---|---|---|---|
| 4,239,016 | A * | 12/1980 | Cathers | B05B 14/465 118/631 |
| 4,431,473 | A * | 2/1984 | Okano | C23F 4/00 156/345.31 |
| 5,338,913 | A * | 8/1994 | Finn | C23C 14/30 373/13 |
| 5,882,415 | A * | 3/1999 | Helling | C23C 14/541 118/719 |
| 6,062,798 | A * | 5/2000 | Muka | H01L 21/67745 414/416.03 |
| 6,246,204 | B1 * | 6/2001 | Ebihara | G03F 7/70358 318/566 |
| 6,416,579 | B1 * | 7/2002 | Thallner | B05B 13/041 118/323 |
| 7,413,639 | B2 * | 8/2008 | Hattendorf | H01J 37/32522 118/719 |
| 2001/0000720 | A1 * | 5/2001 | Goodwin | H01L 21/6838 414/217 |
| 2002/0000029 | A1 * | 1/2002 | Emoto | F16L 9/19 700/121 |
| 2006/0291988 | A1 * | 12/2006 | Machiyama | H01L 21/67276 414/792.7 |
| 2009/0087932 | A1 * | 4/2009 | Kondoh | H01L 21/67196 438/30 |
| 2010/0068417 | A1 * | 3/2010 | Neal | C23C 14/30 427/596 |
| 2014/0238300 | A1 * | 8/2014 | Hisada | C23C 14/48 118/723 R |
| 2014/0238637 | A1 * | 8/2014 | Tanaka | F25B 21/02 165/47 |
| 2015/0170945 | A1 * | 6/2015 | Segawa | H01L 21/67115 414/217 |
| 2015/0197850 | A1 * | 7/2015 | Jost | H01L 21/67173 427/595 |
| 2019/0093213 | A1 * | 3/2019 | Pollack | C23C 14/505 |

* cited by examiner

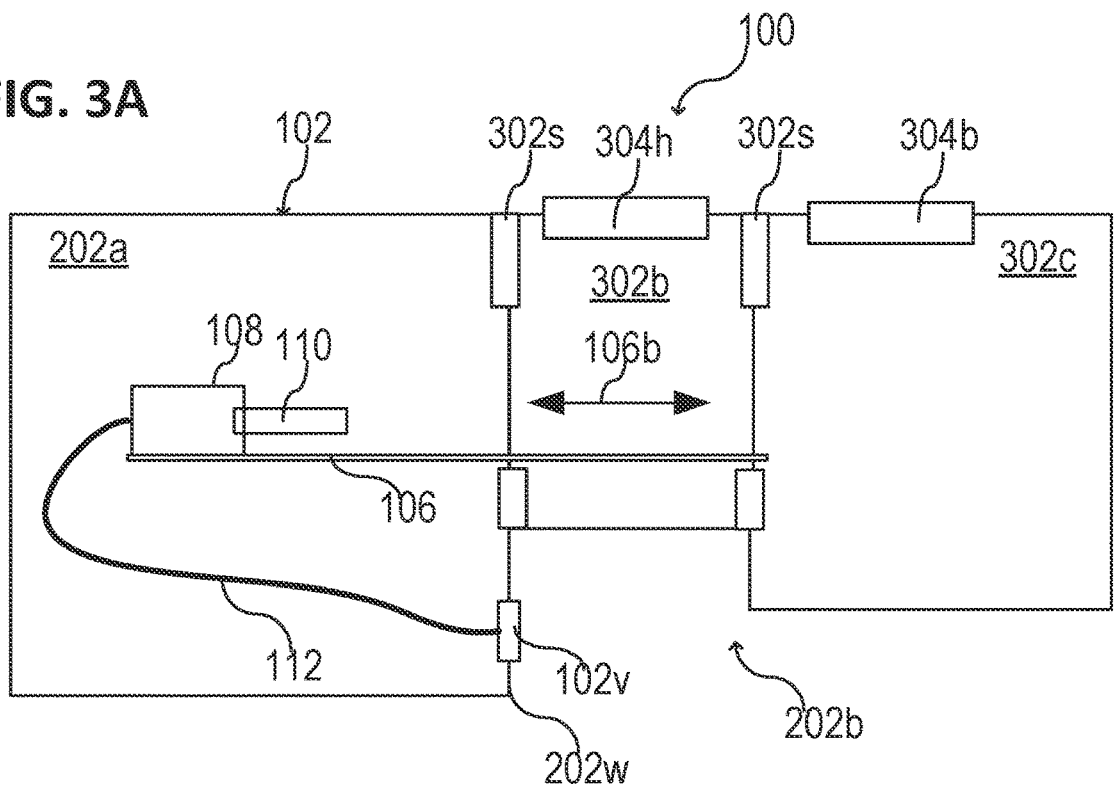
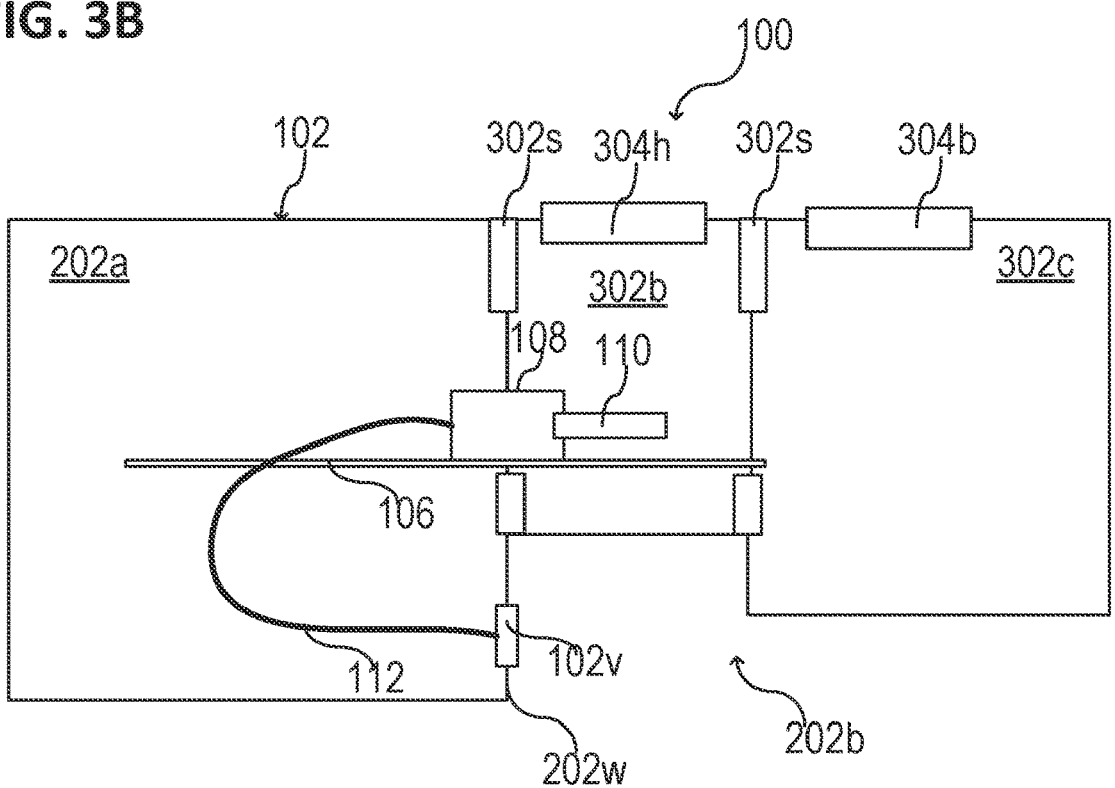

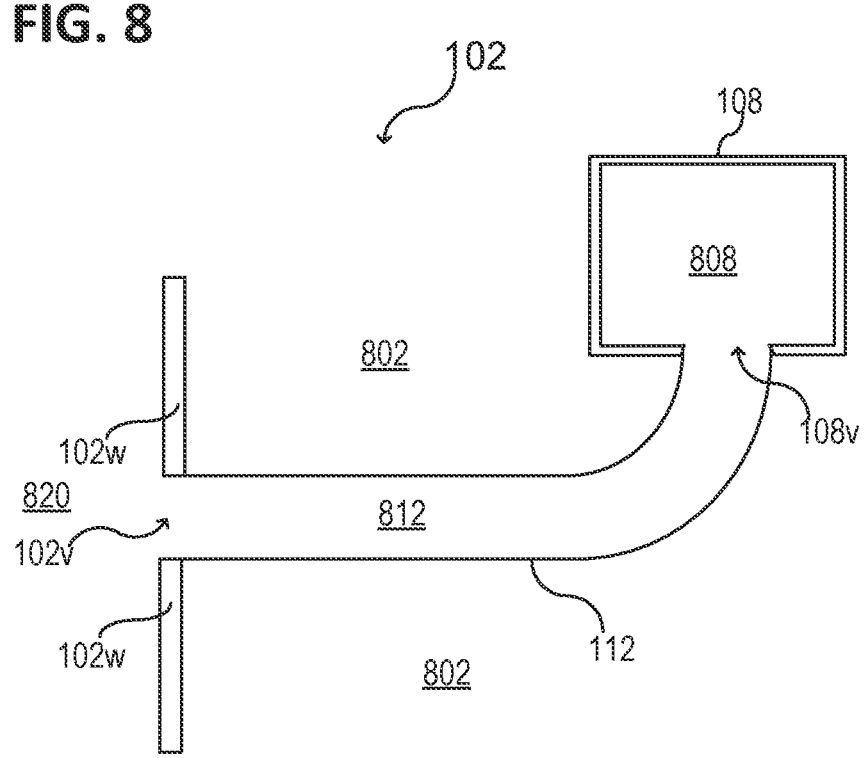

COATING PROCESSES FOR VACUUM CHAMBER ARRANGEMENTS AND APPARATUS THEREOF

CROSS-REFERENCE TO RELATED APPLICATION

This patent application is a divisional of U.S. patent application Ser. No. 15/956,834, filed on Apr. 19, 2018, which claims the benefit of priority to German Application No. DE 10 2017 109 820.8, filed on May 8, 2017, and German Application No. DE 10 2017 108 962.4, filed on Apr. 26, 2017. The contents of each of the foregoing documents are hereby restated and fully incorporated herein by reference.

TECHNICAL FIELD

Various illustrative embodiments relate to a vacuum chamber arrangement and to a vacuum processing arrangement or a vacuum coating arrangement.

BACKGROUND

In general, many different methods are used for processing substrates. Panes of glass, plastic sheets, metal strips, films, wafers, workpieces, or similar can be used as substrates, for example. In conventional practice, it is possible, for example, for substrates to be processed individually or together by means of a processing device, e.g. a vacuum processing plant, an atmospheric-pressure processing plant or an excess-pressure processing plant.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which:

FIGS. 3A to 3C show a vacuum chamber arrangement having a lock chamber and two process chambers in a schematic view in accordance with various embodiments;

FIG. 8 shows a supply housing arranged in a vacuum chamber in a schematic view in accordance with various embodiments.

DESCRIPTION

Figure 1A:
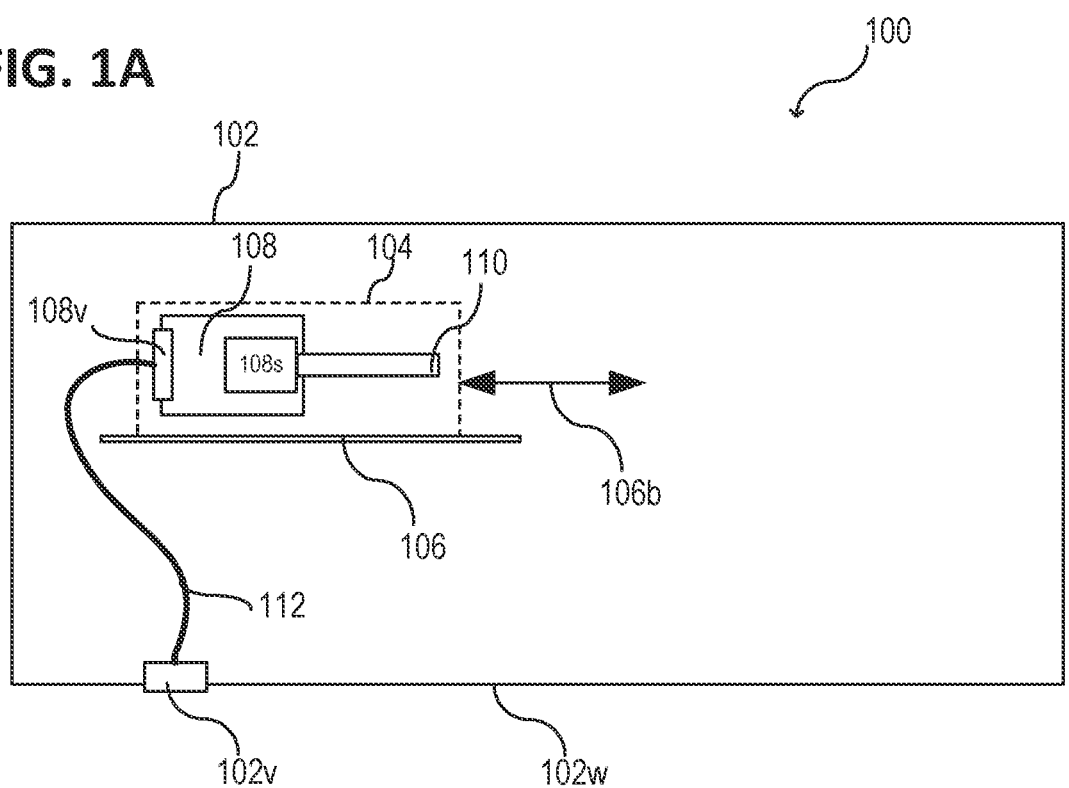
FIGS. 1A and 1B show a vacuum chamber arrangement in a schematic view in accordance with various embodiments, wherein a substrate holding arrangement is mounted in various positions in a vacuum chamber.

In the following detailed description, reference is made to the attached drawings, which are part of the description and in which specific embodiments in which the invention can be implemented are shown for purposes of illustration. In this respect, directional terminology such as "top", "bottom", "forward", "rearward", "front", "rear", etc. is used with reference to the orientation of the figure(s) described. Since components of embodiments can be positioned in a number of different orientations, the directional terminology is used for purposes of illustration and is in no way restrictive. It is self-evident that other embodiments can be used and other structural or logical changes can be made without exceeding the scope of protection of the present invention. It is self-evident that the features of the various illustrative embodiments described herein can be combined, unless specifically stated otherwise. The following detailed description should therefore not be interpreted in a restricted sense, and the scope of protection of the present invention is defined by the attached claims.

In the context of this description, the terms "linked", "connected" and "coupled" are used to describe both direct and indirect linking, direct or indirect connection and direct or indirect coupling. In the figures, identical or similar elements are provided with identical reference signs where expedient.

To process the respective substrates in a vacuum chamber, it may be necessary, for example, to pass media (e.g. electrical energy, cooling water, process gases, the vacuum, torques etc.) into the vacuum chamber, it being possible to achieve this in conventional terms by correspondingly expensive designs. For example, they can be introduced into a vacuum chamber at any required point by means of a vacuum passage (as also referred as passage, feedthrough, etc.). In the case of a large number of media and a multiplicity of locations at which these are to be made available, however, this leads to a correspondingly large number of required vacuum passages, and this can entail disadvantages in terms of cost.

According to various embodiments, a vacuum chamber arrangement for processing substrates is provided, e.g. for the simultaneous processing of a multiplicity of substrates, e.g. turbine blades, e.g. aircraft turbine blades, etc. In this case, the respective routing of media is provided at low cost and in an efficient manner in a vacuum chamber.

In general, turbine blades or other substrates can be provided with one or more protection layers, e.g. ceramic protection layers, by means of gas phase deposition (e.g. physical or chemical gas phase deposition) in order, for example, to improve the wear behavior thereof. For example, turbine blades can be coated by means of a ceramic coating, in particular for thermal insulation relative to the hot gas. According to various embodiments, the vacuum coating plant used for this purpose can have at least one loading, heating and coating chamber or can consist of these.

Plants for the same use can also be provided, for example, by means of chambers which are fewer in number but, for example, have multiple functions, e.g. loading and heating in a common process chamber. According to various embodiments, at least one of the following can be implemented, e.g. to increase productivity:

1. Dual arrangement of a substrate carrier for each substrate transfer unit

2. Dual or quadruple arrangement of loading and heating chambers, which are used sequentially for bidirectional coating of the vapor coating chamber.

3. In-line plants, in which the substrates are moved linearly through the vacuum coating plant based on a cycle time.

According to various embodiments, a substrate carrier (referred to herein as a substrate holder or as a substrate receptacle, for example) can be secured on an atmospheric box (referred to herein as a supply housing, for example). All the required drives and media connections are situated in this box, for example. The drives and media connections in this box can be supplied by means of a flexible (bendable and/or extendable) supply hose. The supply hose can link the atmospheric box to a through hole in the chamber wall of the vacuum chamber in which the atmospheric box is arranged, for example, thus allowing access to the atmospheric box from outside the vacuum chamber.

According to various embodiments, the vacuum plant described herein can be used to coat turbine blades by means of electron beam vapor coating. In this case, a substrate transfer unit (referred to herein as a substrate holding arrangement, for example) can be arranged in such a way as to be movable longitudinally in the vacuum plant and can have the following or consist of the following: a base frame with transport rollers, a longitudinal drive (e.g. by means of a screw or a spindle and a driver) and a thermal shield. The atmospheric box can be arranged on the base frame. At least one of the following can be arranged in the box, for example: drives for the mutually independent tilting of one or more (e.g. two) substrate carriers, drives for rotating the substrates, connections for cooling water, for intermediate vacuum extraction, for air circulation and all the required electrical connections. The two substrate carriers can be secured pivotably on the box by means of two support arms, for example. The respective substrate carrier can be secured pivotably on the box by means of a support arm, for example. It is possible, for example, for the substrate transfer unit to be guided on rails situated in the loading and heating chamber. It is possible, for example, for the substrate transfer unit to be moved longitudinally by means of a spindle situated in the loading chamber. It is possible, for example, for the substrate transfer unit to be moved between a plurality of positions (e.g. three positions): 1. loading/unloading, 2. heating, 3. vapor coating.

The required media for the atmospheric box are carried to the box by means of one or more (e.g. two) flexible lines (referred to herein as supply hoses, for example). The flexible media lines are, for example, flanged by one end thereof to the loading chamber in such a way that they can be connected on the atmosphere side, while they are flanged by the other end thereof to the atmospheric box.

The media lines are passed through the heating chamber while the substrate transfer unit is in the vapor coating position, for example. In this case, the media lines can be arranged in such a way that they are protected sufficiently from heat radiation in this position by a thermal shield.

Figure 1B:
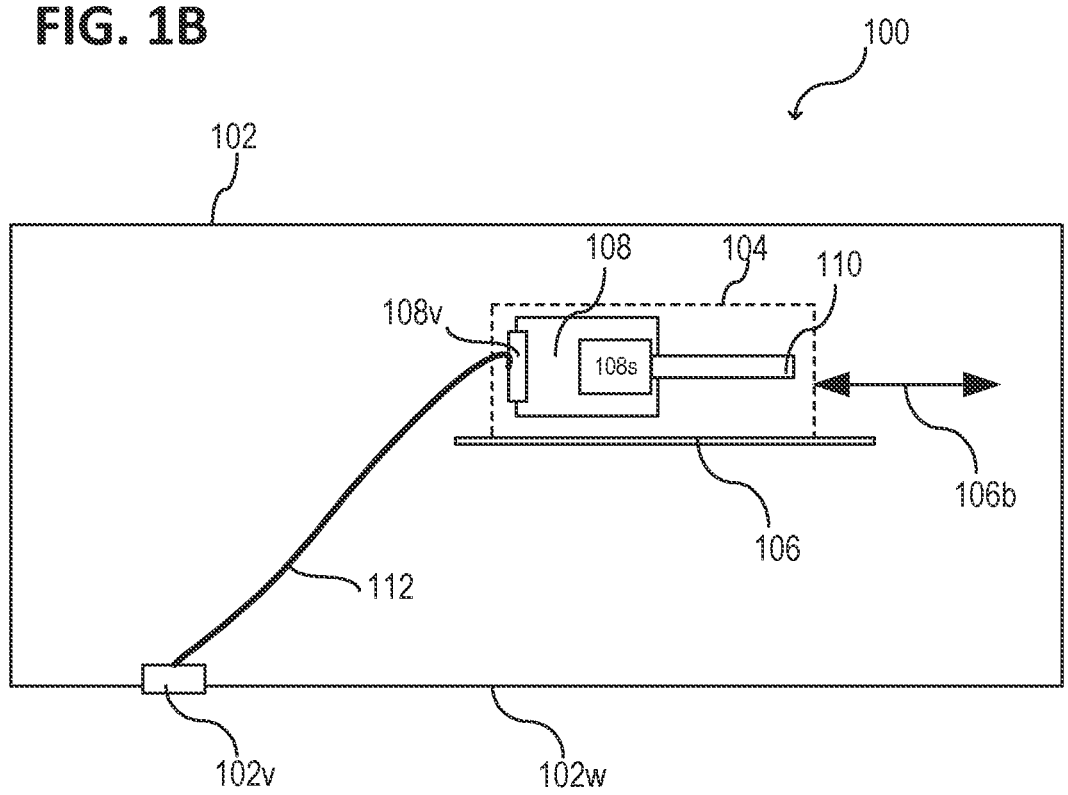

FIG. 1A and FIG. 1B illustrate a vacuum chamber arrangement 100 in a schematic view in accordance with various embodiments. The vacuum chamber arrangement 100 can have a vacuum chamber 102, for example. The vacuum chamber 102 can have a first supply passage 102$v$, for example. The first supply passage 102$v$ can be provided in a chamber wall section 102$w$ of the chamber housing of the vacuum chamber 102, for example.

The vacuum chamber arrangement 100 can have a substrate holding arrangement 104, for example. The substrate holding arrangement 104 can have a substrate holder 110 for holding and positioning at least one substrate. It is possible, for example, for positioning to be setting and/or changing the location and/or the alignment of the substrates relative to a processing source, wherein the processing source is used to process one or more substrates held by means of the substrate holder 110. For this purpose, the vacuum chamber 102 can have a processing region or a process chamber. The substrate holding arrangement 104 can furthermore have a vacuumtight supply housing 108 for supplying the substrate holder 110 with at least one supply medium, e.g. with mechanical energy or a torque, with cooling water or the like. It is possible, for example, for a supply structure 108$s$ to be arranged in the supply housing 108 to supply the substrate holder 110 with the at least one supply medium. It is possible, for example, for the supply structure 108$s$ to have or provide a drive, which is coupled to the substrate holder 110 to position the substrates. Furthermore, the supply structure 108$s$ can have or provide a coolant duct to cool the substrate holder 110 and/or to cool the supply housing 108 itself.

According to various embodiments, the supply housing 108 can have a second supply passage 108$v$. One or more media (e.g. electrical energy and/or coolant) can be fed to the supply housing 108 by means of the second supply passage 108$v$, for example.

The vacuum chamber arrangement 100 can furthermore have a bearing arrangement 106, for example, by means of which the substrate holding arrangement 104 is supported movably 106$b$ within the vacuum chamber 102.

The vacuum chamber arrangement 100 can furthermore have a (e.g. vacuumtight) supply hose 112, for example. The supply hose 112 can link the first supply passage 102$v$ of the vacuum chamber 102 to the second supply passage 108$v$ of the supply housing 108, for example. According to various embodiments, the peripheral wall of the supply hose 112 can be vacuumtight.

Figure 2A:
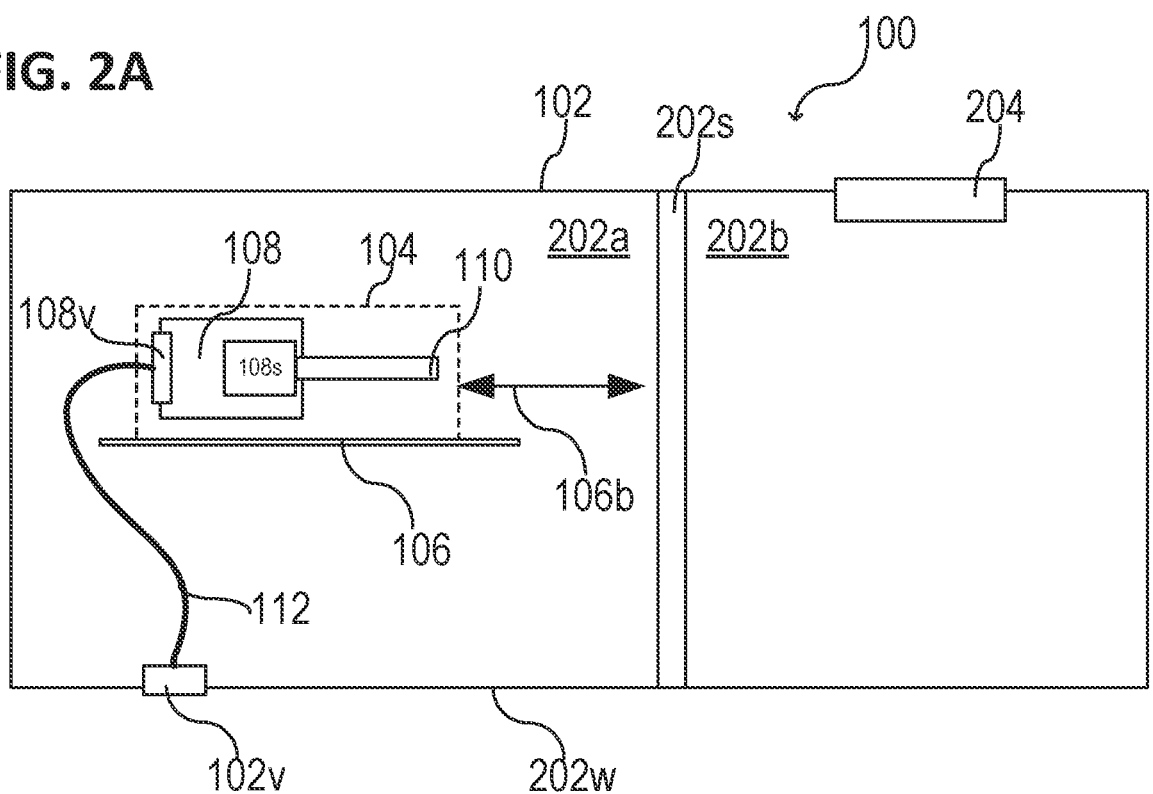
FIGS. 2A and 2B show a vacuum chamber arrangement with a lock chamber and a process chamber in a schematic view in accordance with various embodiments.
Figure 2B:
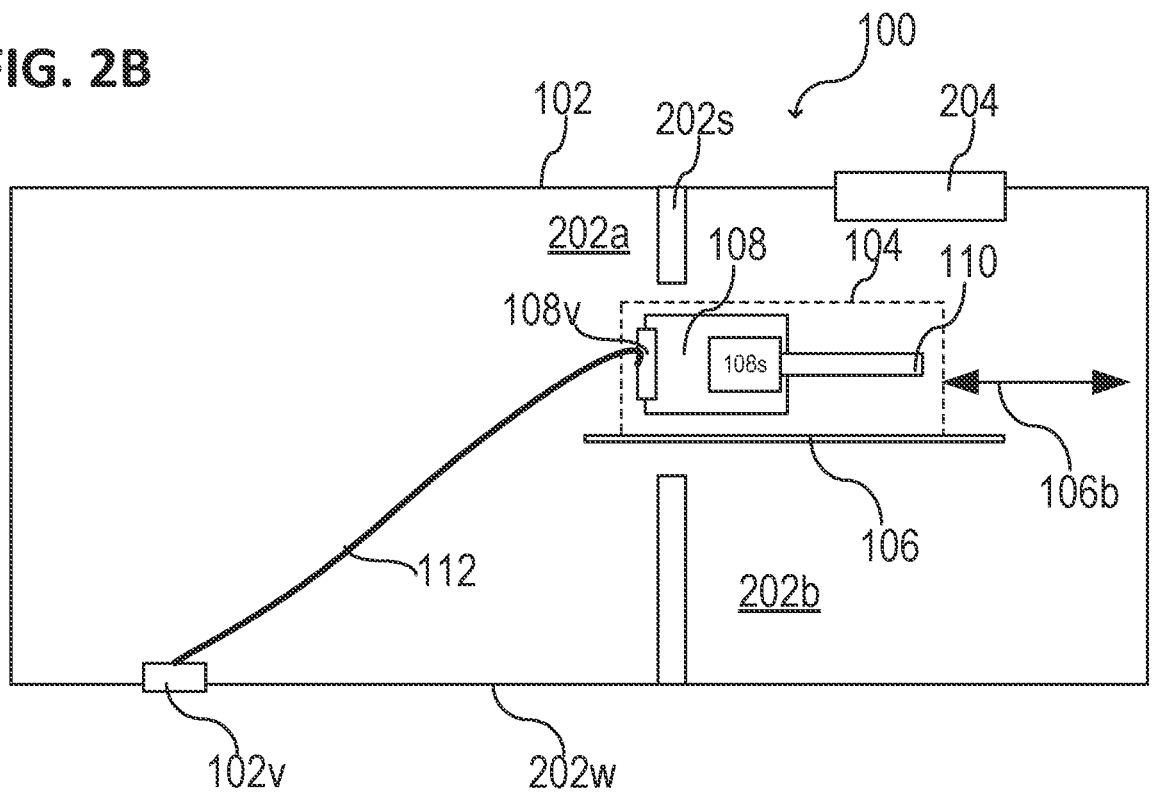

FIG. 2A and FIG. 2B illustrate a vacuum chamber arrangement 100 in a schematic view in accordance with various embodiments. In this case, the vacuum chamber 102 has a lock chamber 202$a$ and at least one process chamber 202$b$. Furthermore, a valve arrangement 202$s$ (e.g. a flap valve, a slide valve or some other suitable vacuum valve) can be used to separate the lock chamber 202$a$ from the at least one process chamber 202$b$ in respect of the vacuum.

Figure 3C:
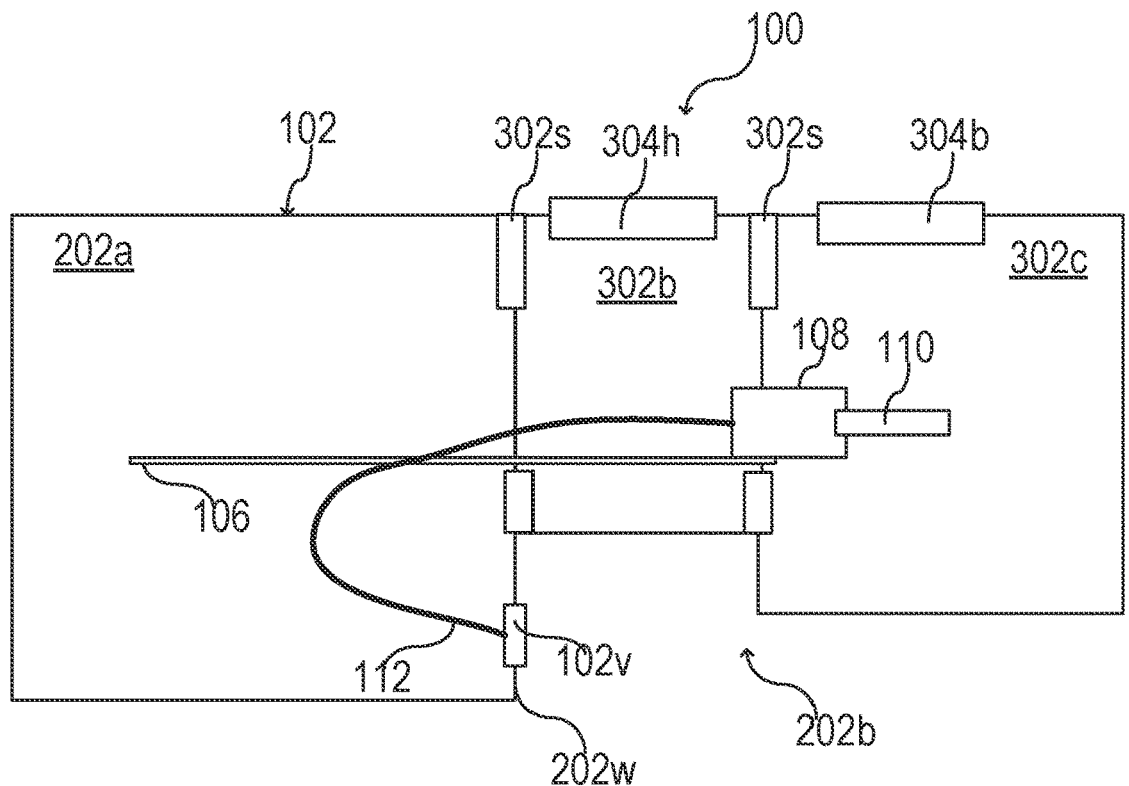

It is possible, for example, for the at least one process chamber 202$b$ to have a heating chamber and a coating chamber of the kind illustrated by way of example in FIGS. 3A to 3C.

According to various embodiments, the first supply passage 102$v$ can be arranged in a chamber wall section 202$w$ of the lock chamber 202$a$, and the bearing arrangement 106 can be configured in such a way, for example, that at least the substrate holder 110 of the substrate holding arrangement 104 can be moved out of the lock chamber 202$a$ into the at least one process chamber 202$b$ and/or that at least the substrate holder 110 of the substrate holding arrangement 104 can be moved out of the at least one process chamber 202$b$ into the lock chamber 202$a$.

According to various embodiments, the supply structure 108$s$ can have an electric drive (e.g. one or more electric motors) for driving the positioning of the at least one substrate.

It is possible, for example, for the substrate holder 110 to have one or more joints, which provide/provides one or more degrees of freedom of movement for the positioning of the at least one substrate by means of the substrate holder 110.

According to various embodiments, the substrate holding arrangement 104 is supported in such a way by means of the bearing arrangement 106 that it can be moved 106$b$ between at least one first and one second position, see, for example, FIG. 1A and FIG. 1B as well as FIG. 2A and FIG. 2B and FIGS. 3A to 3C. It is possible, for example, for the substrate holder 110 to be arranged in the first position within the lock chamber 202a and to be arranged in the second position within the at least one process chamber 202b. As is apparent, the substrate holder 110 can be positioned in various positions in the vacuum chamber 102.

According to various embodiments, the bearing arrangement 106 is used to position the entire substrate holding arrangement 104 in the vacuum chamber 102, and the substrate holder 110 of the substrate holding arrangement 104 is used to position the substrates relative to a processing device 204 for processing the substrates, e.g. for the uniform coating of the substrates.

To load the substrate holder 110 of the substrate holding arrangement 104 with at least one substrate or to remove at least one substrate from the vacuum chamber, the substrate holder 110 or the substrate holding arrangement 104 can be moved into the lock chamber 202a, the process chamber 202b can be separated from the lock chamber 202a by means of the valve arrangement 202s, and the lock chamber 202a can be opened, for example, providing access to the substrate holder 110.

The vacuum chamber arrangement 100 can have a processing source 204 designed as a coating source, for example. The coating source can have one or more crucibles, in which material for evaporation (also referred to as sublimation material) can be held ready. The evaporation energy can be provided by means of one or more electron beam guns. During coating of the substrates by means of electron beam evaporation, the at least one crucible can be arranged underneath the substrates, the substrates thus being coated from below. As an alternative, a different coating device can be used to coat the substrates, e.g. a sputtering arrangement or the like.

According to various embodiments, the substrate holder 110 can have at least one pivotably supported support arm. The at least one pivotably supported support arm can have at least one rotatably supported substrate receptacle for receiving and positioning at least one substrate, for example.

The vacuum chamber 102 can furthermore have one or more vacuumtightly closable process chambers 202b, lock chambers 202a etc. The individual chambers can be brought to a predefined process atmosphere with a pressure of less than 1 mbar, e.g. less than 10 2 mbar, e.g. less than 10 4 mbar, e.g. less than 10 6 mbar by means of an evacuation device (e.g. having one or more vacuum pumps and, as an option for example, a gas feed).

According to various embodiments, the processing of the substrates, in particular the coating of one or more turbine blades with a thermal protection layer, can take place at a process temperature of, for example, greater than 800° C. Thermal protection layers, referred to as thermal barrier coatings (TBC), can be formed from yttrium-stabilized zirconium dioxide (ZrO2), for example. Alternatively, other suitable materials (e.g. metallic and/or ceramic materials) can be deposited as functional layers on the substrates, e.g. adhesion promoting layers (also referred to as bond coats).

Owing to the process temperature that can be used to coat the substrates or process them in some other way, which can be high for example, it may be helpful to cool internal fittings in the vacuum chamber 102. For example, it may be helpful to cool the substrate holding arrangement 104 at least in some section or sections and/or to provide heat shield plates or the like (see FIG. 5, for example).

According to various embodiments, the supply housing 108 can have a cooling structure, preferably at least one cooling duct, for cooling the supply housing 108, preferably by means of a cooling liquid.

According to various embodiments, the supply hose 112 can be vacuumtight and flexible and have a length such that the substrate holding arrangement 104 can be moved 106b within the vacuum chamber 102 while, simultaneously, the vacuumtight supply hose 112 links the first supply passage 102v and the second supply passage 108v to one another. According to various embodiments, a corrugated hose (e.g. an ISO-KF or ISO-CF hose) can be used as a supply hose 112.

The supply hose 112, which is vacuumtight for example, the vacuumtight supply housing 108, the first supply passage 102v and the second supply passage 108v can be configured in such a way that the interior of the supply hose 112 and the interior of the supply housing 108 are separated from the interior of the vacuum chamber 102 in respect of the vacuum, see FIG. 8, for example. Thus, for example, a higher pressure (e.g. standard atmospheric pressure) can be provided in the supply hose 112 and in the supply housing 108 than in the vacuum chamber.

At least one electric supply lead and/or at least one coolant supply line is/are arranged within the supply hose 112, for example.

The bearing arrangement 106 can, for example, define a motion plane (also referred to as a transfer plane) within which the substrate holding arrangement 104 can be moved 106b by means of the bearing arrangement 106. Furthermore, the supply hose 112 can be guided in a supply plane, which is aligned perpendicularly or parallel to the motion plane.

The supply hose 112 can form a common protective sleeve for a plurality of supply lines, for example, wherein the plurality of supply lines can be routed within the supply hose 112 from outside the vacuum chamber 102 into the supply housing 108.

Alternatively, the supply hose 112 can also carry just one supply line or can be configured as a supply line.

The supply hose 112 can be flexible, for example, e.g. in such a way that it can be routed with a bending radius of less than 1 m in the vacuum chamber, for example.

FIGS. 3A to 3C each illustrate a vacuum chamber arrangement 100 in a schematic view in accordance with various embodiments. In this case, the vacuum chamber 102 has a lock chamber 202a and at least two process chambers 202b. Furthermore, a valve arrangement 302s can be used to separate the lock chamber 202a in respect of the vacuum from a process chamber 202b adjoining said lock chamber. Another valve arrangement 302s can be used to separate adjoining process chambers 202b in respect of the vacuum.

The plurality of process chambers 202b can have at least one heating chamber 302b and at least one coating chamber 302c, for example.

The first supply passage 102v can be arranged in a chamber wall section 202w of the lock chamber 202a, and the bearing arrangement 106 can be configured in such a way, for example, that at least the substrate holder 110 of the substrate holding arrangement 104 can be moved 106b out of the lock chamber 202a into the plurality of process chambers 202b and/or that at least the substrate holder 110 of the substrate holding arrangement 104 can be moved out of the plurality of process chambers 202b into the lock chamber 202a. According to various embodiments, at least the substrate holder 110 of the substrate holding arrangement 104 can be moved through the heating chamber 302b into the coating chamber 302c. As is apparent, the substrates which are transferred by means of the substrate holding arrangement 104 are first of all heated in the heating chamber 302b and then coated in the coating chamber 302c.

To load the substrate holder 110 of the substrate holding arrangement 104 with at least one substrate or to remove at least one substrate from the vacuum chamber, the substrate holder 110 or the substrate holding arrangement 104 can be moved into the lock chamber 202a, the heating chamber 302b can be separated from the lock chamber 202a by means of the valve arrangement 302s, and the lock chamber 202a can be opened, for example, thus making it possible to provide access to the substrate holder 110 of the substrate holding arrangement 104.

According to various embodiments, the vacuum chamber 102 of the vacuum chamber arrangement 100 can also have a plurality of heating chambers 302b. According to various embodiments, the vacuum chamber arrangement 100 can have a heating arrangement 304h (e.g. having at least one heater, e.g. having at least one radiant heater) for heating a heating region in the heating chamber 302b or for heating one or more substrates in the heating chamber 302b.

According to various embodiments, the vacuum chamber arrangement 100 can have a coating arrangement 304b (e.g. having at least one coating source, e.g. having at least one electron beam evaporator) for heating one or more substrates in the coating chamber 302c.

Figure 4:
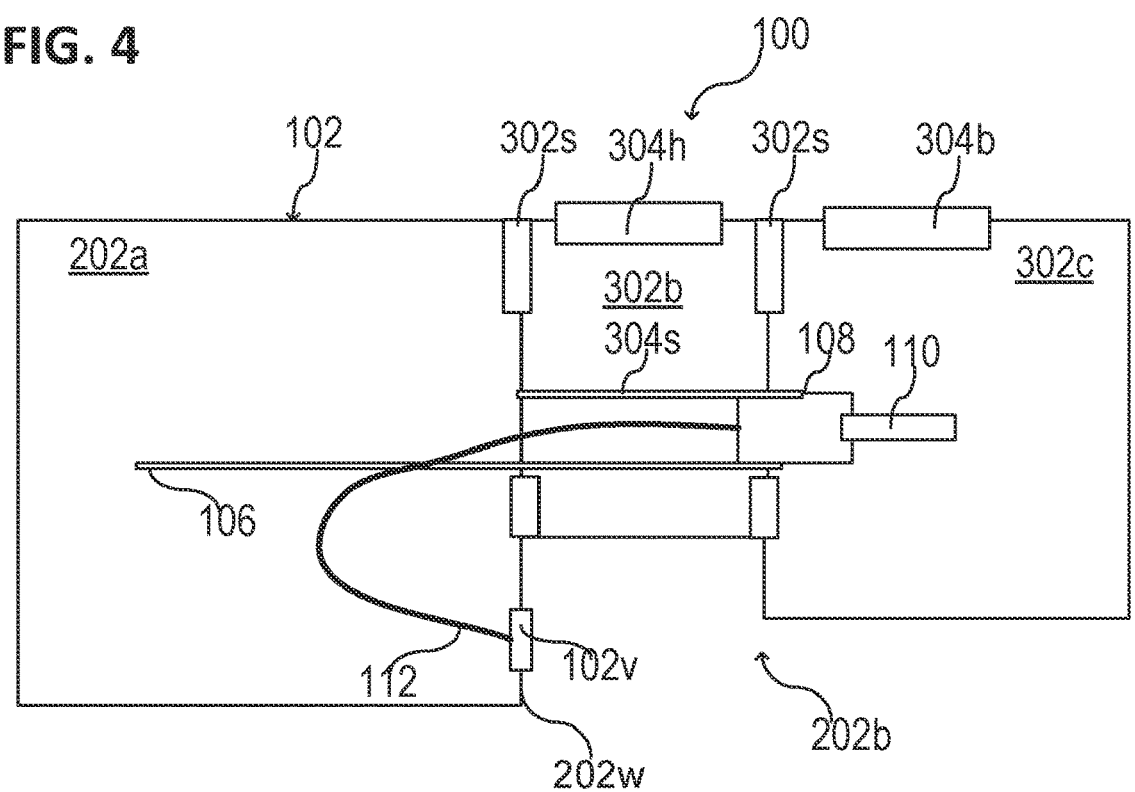
FIG. 4 shows a vacuum chamber arrangement in a schematic view in accordance with various embodiments.

When the substrate holder 110 is positioned in the coating chamber 302c by means of the movably supported substrate holding arrangement 104, as illustrated in FIG. 3C, for example, the substrate holding arrangement 104 can be arranged at least partially in the heating chamber 302b. Furthermore, at least a section of the supply hose 112 can be passed through the heating chamber 302b. It may therefore be helpful to protect the substrate holding arrangement 104 (e.g. the supply housing 108) and/or the supply hose 112 by means of a heat shield 304s, e.g. to cover at least a section thereof, as illustrated in a schematic view in FIG. 4.

According to various embodiments, the substrate holding arrangement 104 can be movably supported by means of rollers. In other words, the bearing arrangement 106 can be a rail system on which the substrate holding arrangement 104 can be moved by means of rollers. As an alternative, other suitable bearings (e.g. sliding bearings) can also be used for the guided movement of the substrate holding arrangement 104.

Figure 5:
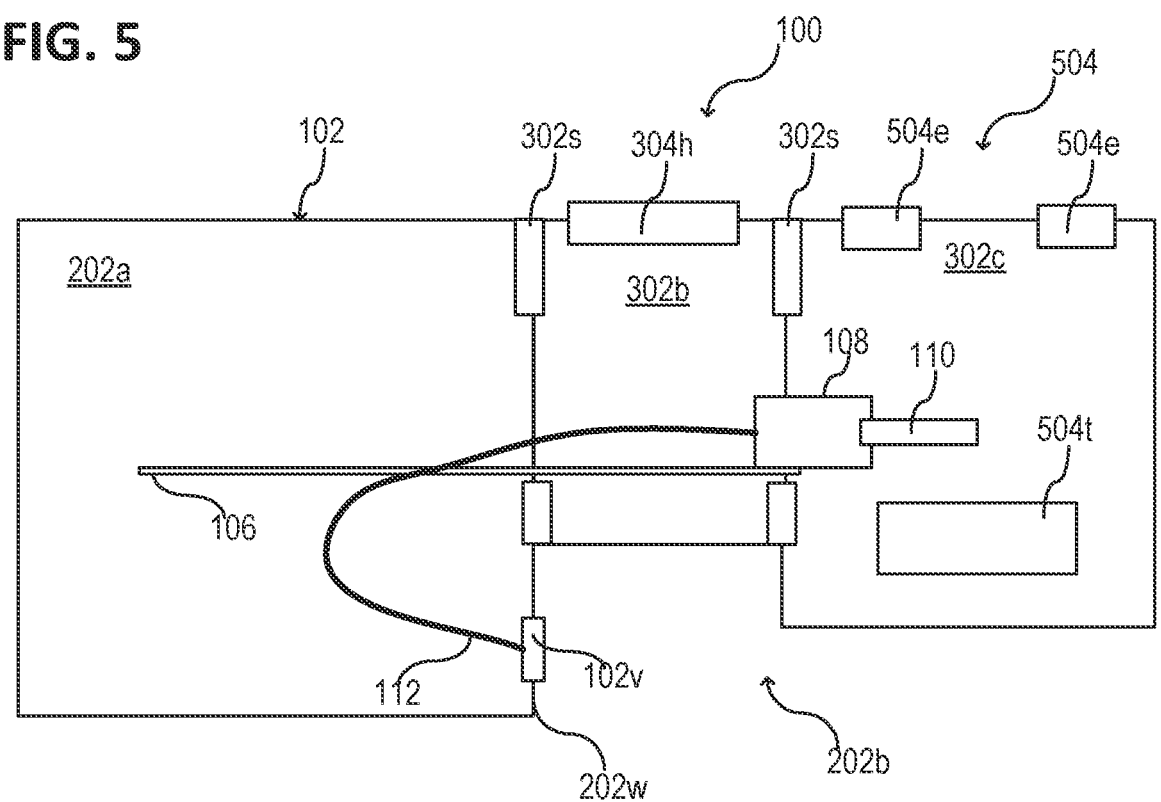
FIG. 5 shows a vacuum chamber arrangement in a schematic view in accordance with various embodiments.

According to various embodiments, the vacuum chamber arrangement 100 can have one electron beam evaporator arrangement 504 for coating the substrates in the coating chamber 302c, as illustrated in a schematic view in FIG. 5, for example.

The electron beam evaporator arrangement 504 can have one or more electron beam guns 504e, for example, by means of which vapor sources are formed on a target material 504t. As is apparent, the target material 504t can be evaporated by means of the electron beams which are emitted by one or more electron beam guns 504e. By means of the evaporated target material, the substrates can then be coated, for example. The target material 504t (also referred to as evaporation material) can be held in one or more crucibles, for example.

The respectively used electron beam gun 504e can have a corresponding deflection system, for example, for deflecting the electron beam produced (e.g. in accordance with a predefined beam figure), thus allowing the electron beam to be targeted at the target material 504t and enabling it to produce at least one vapor source on the target material 504t. Here, the respective electron beam can be guided in such a way that the substrates can be coated from below by means of the target material 504t, wherein at least one electron beam gun 504e can be arranged above the substrates. As an alternative, it is also possible for an electron beam gun 504e to be arranged laterally with respect to the substrates and for the respective electron beam to be fired laterally between the substrates and the target material 504t. If helpful, the deflection of an electron beam within the coating chamber 302c can be accomplished by means of a magnetic field, for example, i.e. magnets and/or coils can be used to guide the respective electron beam onto the target material 504t in a suitable manner.

Figure 6:
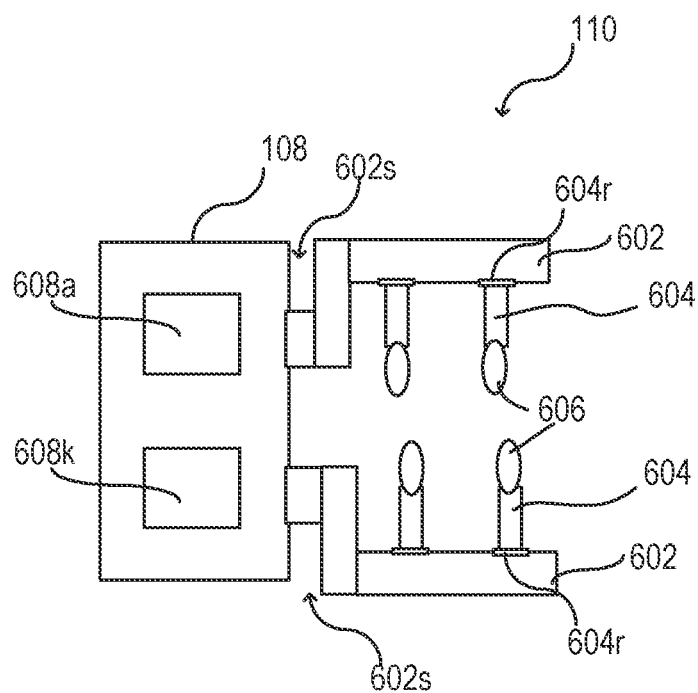
FIG. 6 shows a substrate holder and a supply housing in a schematic view in accordance with various embodiments.

FIG. 6 illustrates a substrate holder 110 in a schematic view in accordance with various embodiments. The substrate holder 110 is configured to hold a plurality of substrates 606, for example. As described above, the substrate holder 110 can be mounted on the supply housing 108 or supported and moved by means of a drive arrangement 608a, which is arranged at least partially in the supply housing 108.

According to various embodiments, the drive arrangement 608a and the substrate holder 110 can be configured in such a way that a predefined pattern of movement can be transmitted to the substrates 606. It is self-evident that a correspondingly configured mechanism, having, for example, motors, gearwheels, toothed belts, flat belts, rollers, pulleys etc. can be used, as can a correspondingly configured control system.

In one embodiment, it is possible to use a plurality of support arms 602 (e.g. two), which are pivotably and/or rotatably supported by means of a joint 602s, wherein a plurality of substrate receptacles 604 can be mounted on each of the plurality of support arms 602. The substrate receptacles 604 can be pivotably and/or rotatably supported by means of another joint 604r, for example. The substrate receptacles 604 are configured in such a way, for example, that in each case at least one substrate 606 can be fixed on each of the substrate receptacles 604. According to various embodiments, the pivoting/rotation axis of the joint 602s can be aligned at an angle (e.g. substantially at a right angle) to the pivoting/rotation axis of the other joint 604r. It is self-evident that other configurations can be used to hold and, where appropriate, to position (e.g. align, rotate, pivot etc.) one or more substrates 606 in a corresponding fashion by means of the substrate holder 110.

Furthermore, a cooling structure 608k can be provided in the supply housing 108 to cool the supply housing 108 itself and/or to cool the substrate holder 110. It is self-evident that at least one correspondingly configured cooling circuit can be provided, having, for example, cooling lines, sensors, valves etc., in order to cool the supply housing 108 itself and/or to cool the substrate holder 110.

Figure 7:
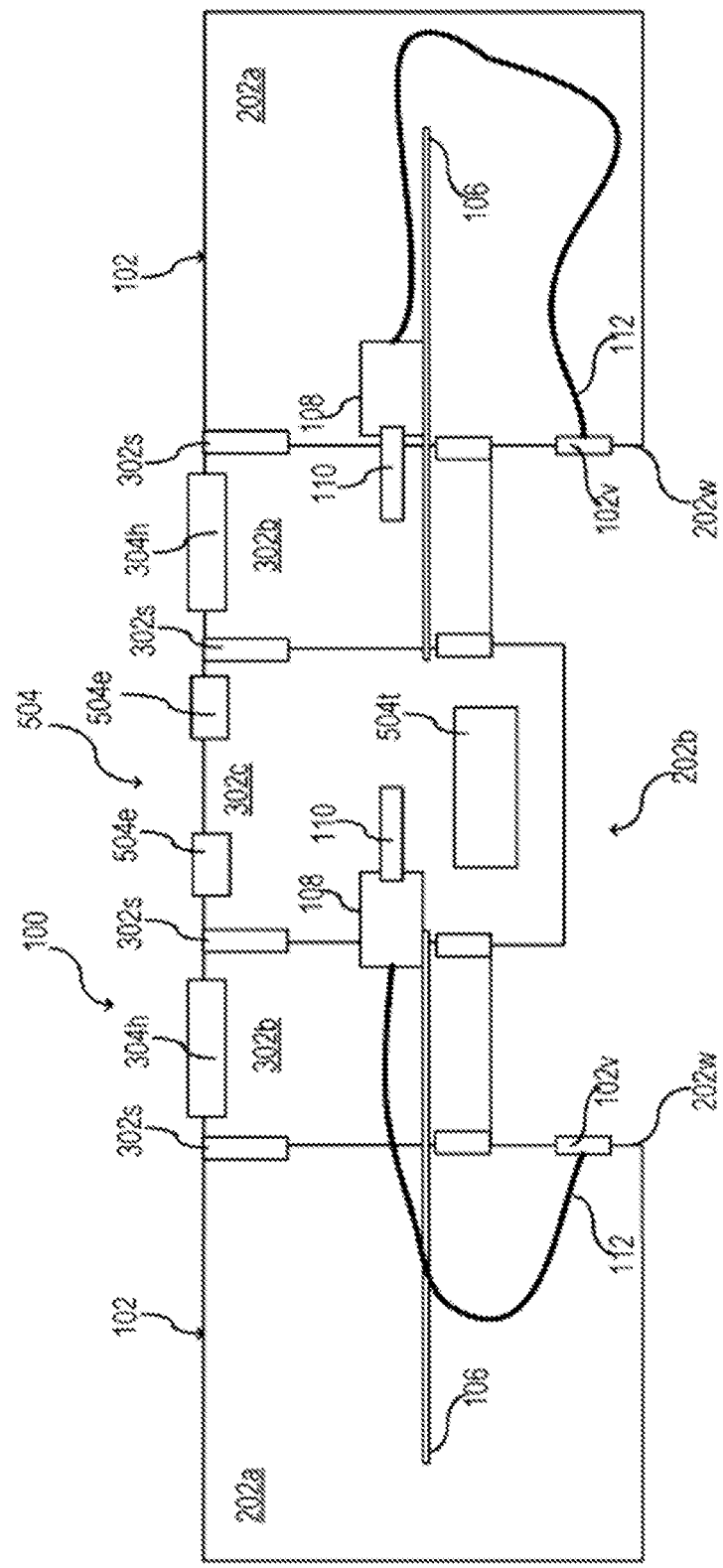
FIG. 7 shows a vacuum chamber arrangement in a schematic view in accordance with various embodiments.

FIG. 7 illustrates a vacuum chamber arrangement 100 in a schematic view in accordance with various embodiments. In this case, the vacuum chamber 102 has two lock chambers 202a and at least three process chambers 202b. Furthermore, a valve arrangement 302s separating the respective lock chamber 202a in respect of the vacuum from a process chamber 202b adjoining said lock chamber can be used. A plurality of further valve arrangements 302s can be used to separate mutually adjacent process chambers 202b in respect of the vacuum.

The plurality of process chambers 202b can, for example, have two heating chambers 302b and a coating chamber 302c arranged between the two heating chambers. The substrates can be fed to the coating chamber 302c from two mutually opposite sides, e.g. in each case by means of a substrate holding arrangement 104, a bearing arrangement 106 and a supply hose 112, as described above. As is apparent, substrates can be transferred into the coating chamber 302c by means of a first substrate holding arrangement 104 and a second substrate holding arrangement 104, and can be coated in succession or alternately.

FIG. 8 illustrates a schematic view of the supply housing 108 and the supply hose 112 in accordance with various embodiments.

The supply hose 112, the vacuumtight supply housing 108 and the supply passages 102v, 108v can be configured in such a way that the interior 812 of the supply hose 112 and the interior 808 of the supply housing 108 is separated from the interior 802 of the vacuum chamber 102 in respect of the vacuum. It is thus possible, for example, for atmospheric pressure 820 to prevail outside the vacuum chamber, and this then also prevails in the supply housing 108. As is apparent, the supply housing 108 is supplied with air or connected in a gas-transmitting manner to the environment around the vacuum chamber 102 by means of the supply hose 112.

It is thus possible, for example, for a higher pressure (e.g. standard atmospheric pressure 820) to be provided in the supply hose 112 and in the supply housing 108 than in the vacuum chamber 102.

At least one electric supply lead and/or at least one coolant supply line can be arranged within the supply hose 112, for example. It is also possible, for example, for a first supply hose 112 to be provided for one or more electric supply leads and for a second supply hose 112 to be provided for one or more coolant supply lines.

By means of the supply housing 108 described herein, it is possible, for example, for a movably supported substrate carrier (or some other movably supported internal fitting) to be supplied with the correspondingly desired media in a structurally simple and reliable manner.

According to various embodiments, the supply housing 108 can have a plurality of second supply passages 108v and, in corresponding fashion, the vacuum chamber 102 can have a plurality of first supply passages 102v, wherein the respective first and second supply passages 102v, 108v are connected to respective separate supply hoses 112.

Various examples which relate to what has been described above and illustrated in the figures are described below.

Example 1 is a vacuum chamber arrangement 100 having: a vacuum chamber 102, which has a first supply passage 102v; a substrate holding arrangement 104 having a substrate holder 110 for holding and positioning at least one substrate, a vacuumtight supply housing 108 for supplying the substrate holder 110 with at least one supply medium, wherein the supply housing 108 has a second supply passage 108v; a bearing arrangement 106, by means of which the substrate holding arrangement 104 is supported movably (e.g. movable in a linear manner) within the vacuum chamber 102; and a supply hose 112, which links the first supply passage 102v to the second supply passage 108v.

In Example 2, the vacuum chamber arrangement 100 according to Example 1 can have the optional feature that the vacuum chamber 102 has a lock chamber 202a and at least one process chamber 202b. The vacuum chamber arrangement 100 and the vacuum chamber 102 can furthermore have a valve arrangement 202s for separating the lock chamber 202a and the at least one process chamber 202b from one another in respect of the vacuum.

In Example 3, the vacuum chamber arrangement 100 according to Example 2 can have the optional feature that the first supply passage 102v is arranged in a chamber wall section 202w of the lock chamber 202a. In this case, the bearing arrangement 106 can be configured in such a way that at least the substrate holder 110 of the substrate holding arrangement 104 can be moved out of the lock chamber 202a into the at least one process chamber 202b and/or out of the at least one process chamber 202b into the lock chamber 202a.

In Example 4, the vacuum chamber arrangement 100 according to one of Examples 1 to 3 can have the optional feature that a supply structure 108s is arranged in the supply housing 108. The supply structure 108s can be or have an electric drive arrangement 608a, for example, for driving the positioning of the at least one substrate 606. The supply structure 108s can furthermore have a coolant duct 608k for cooling the substrate holder 110 and/or for cooling the supply housing 108.

In Example 5, the vacuum chamber arrangement 100 according to one of Examples 1 to 4 can have the optional feature that the substrate holder 110 has at least one joint 602s, 604r, wherein the at least one joint 602s, 604r provides at least one degree of freedom of movement for positioning at least one substrate 606.

In Example 6, the vacuum chamber arrangement 100 according to one of Examples 1 to 5 can have the optional feature that the substrate holding arrangement 104 is supported so as to be movable 106b between at least one first and one second position by means of the bearing arrangement 106.

In Example 7, the vacuum chamber arrangement 100 according to Example 2 or 3 can have the optional feature that the substrate holding arrangement 104 is supported so as to be movable 106b between at least one first and one second position by means of the bearing arrangement 106, wherein the substrate holder 110 is arranged within the lock chamber 202a in the first position and wherein the substrate holder 110 is arranged within the at least one process chamber 202b in the second position.

In Example 8, the vacuum chamber arrangement 100 according to one of Examples 1 to 7 can have the optional feature that the substrate holder 110 has at least one pivotably supported support arm 602, and wherein the at least one support arm 602 has at least one rotatably supported substrate receptacle 604 for receiving and positioning at least one substrate 606.

In Example 9, the vacuum chamber arrangement 100 according to one of Examples 1 to 8 can have the optional feature that the supply structure 108s is configured for supplying the substrate holder 110 with a coolant (e.g. a cooling liquid and/or a cooling gas).

In Example 10, the vacuum chamber arrangement 100 according to one of Examples 1 to 9 can have the optional feature that the supply housing 108 has a cooling structure for cooling the supply housing 108.

In Example 11, the vacuum chamber arrangement 100 according to one of Examples 1 to 10 can have the optional feature that the supply hose 112 is vacuumtight and flexible and has a length such that or is configured such that the substrate holding arrangement 104 can be moved within the vacuum chamber 102 while, simultaneously, the supply hose 112 links the first supply passage 102v and the second supply passage 108v to one another.

In Example 12, the vacuum chamber arrangement 100 according to one of Examples 1 to 11 can have the optional feature that the supply hose 112, the vacuumtight supply housing 108 and the first supply passage 102v and the second supply passage 108v are configured in such a way that the interior 812 of the supply hose 112 and the interior 808 of the supply housing 108 are separated in respect of the vacuum from the interior 802 of the vacuum chamber 102.

In Example 13, the vacuum chamber arrangement 100 according to one of Examples 1 to 12 can have the optional feature that at least one electric supply lead and/or at least one coolant supply line is/are arranged within the supply hose 112.

In Example 14, the vacuum chamber arrangement 100 according to one of Examples 1 to 13 can have the optional feature that the bearing arrangement 106 defines a motion plane within which the substrate holding arrangement can be moved by means of the bearing arrangement, and wherein the supply hose 112 is guided in a supply plane, which is aligned perpendicularly or parallel to the motion plane.

In Example 15, the vacuum chamber arrangement 100 according to one of Examples 1 to 14 can have the optional feature that the supply hose 112 forms a common protective sleeve for a plurality of supply lines, wherein the plurality of supply lines is passed into the supply housing within the supply hose 112 from outside the vacuum chamber.

What is claimed is:

1. A method comprising:
coating at least one workpiece using a vacuum chamber arrangement,
wherein the vacuum chamber arrangement comprises:
    a vacuum chamber comprising
        a first supply passage defining a through hole in a chamber wall of a chamber housing of the vacuum chamber, and
        an additional first supply passage defining a through hole in a chamber wall of the chamber housing of the vacuum chamber;
    a substrate holding arrangement comprising
        a substrate holder configured to hold and position at least one substrate, and
        a vacuumtight supply housing configured to supply the substrate holder with at least one supply medium,
        wherein the vacuumtight supply housing comprises a second supply passage;
    an additional substrate holding arrangement comprising
        an additional substrate holder configured to hold and position at least one additional substrate, and
        an additional vacuumtight supply housing configured to supply the additional substrate holder with at least one supply medium,
        wherein the additional vacuumtight supply housing comprises an additional second supply passage;
    one or more bearings configured to support the substrate holding arrangement and the additional substrate holding arrangement within the vacuum chamber;
    a supply hose configured to be attached to the first supply passage and to the second supply passage; and
    an additional supply hose configured to be attached to the additional first supply passage and to the additional second supply passage,
wherein the vacuum chamber comprises a lock chamber, a heating chamber, and a coating chamber,
wherein the vacuum chamber comprises a valve configured to separate the lock chamber from the heating chamber,
wherein the one or more bearings are configured to support the substrate holding arrangement in such a way that the substrate holding arrangement can be moved, via the valve, between a first position in the lock chamber and a second position in the coating chamber,
wherein the supply hose is configured in such a way that the substrate holding arrangement can be moved between the first position in the lock chamber and the second position in the coating chamber while, simultaneously, the supply hose maintains a vacuumtight attachment to the first supply passage and the second supply passage,
wherein the vacuum chamber comprises an additional lock chamber and an additional heating chamber,
wherein the vacuum chamber comprises an additional valve configured to separate the additional lock chamber from the additional heating chamber,
wherein the one or more bearings are configured to support the additional substrate holding arrangement in such a way that the additional substrate holding arrangement can be moved, via the additional valve, between an additional first position in the additional lock chamber and an additional second position in the coating chamber,
wherein the additional supply hose is configured in such a way that the additional substrate holding arrangement can be moved between the additional first position in the additional lock chamber and the additional second position in the coating chamber while, simultaneously, the additional supply hose maintains a vacuumtight attachment to the additional first supply passage and the additional second supply passage,
wherein the at least one workpiece comprises the at least one substrate and/or the at least one additional substrate.

2. The method of claim 1,
wherein the at least one workpiece comprises the at least one substrate,
wherein the at least one substrate comprises a plurality of substrates, and
wherein coating the at least one workpiece comprises simultaneously coating each substrate of the plurality of substrates with a thermal protection layer.

3. The method of claim 1,
wherein coating the at least one workpiece comprises coating the at least one workpiece by electron beam vapor coating.

4. The method of claim 3,
wherein the at least one workpiece comprises the at least one substrate,
wherein coating the at least one workpiece by electron beam vapor coating comprises evaporating a target material that is located below the at least one workpiece.

5. The method of claim 1,
wherein the at least one workpiece comprises the at least one substrate and the at least one additional substrate, and
wherein coating the at least one workpiece comprises alternating between coating the at least one substrate and coating the at least one additional substrate.

6. The method of claim 1,
wherein the first supply passage is located in a chamber wall section of the lock chamber, and
wherein the one or more bearings are configured to support the substrate holding arrangement in such a way that at least the substrate holder of the substrate holding arrangement can be moved out of the lock chamber and into the coating chamber and/or out of the coating chamber and into the lock chamber.

7. The method of claim 1,
wherein at least one of the following is located in the vacuumtight supply housing:
an electric drive configured to enable the at least one substrate to be positioned, or
a coolant duct configured to enable cooling of the substrate holder, and/or cooling of the vacuumtight supply housing.

8. The method of claim 1,
wherein the substrate holder comprises at least one joint configured to provide at least one degree of freedom of movement for the at least one substrate to be positioned.

9. The method of claim 1,
wherein the substrate holder comprises a joint and at least one support arm, and
wherein the joint is configured to pivotably support the at least one support arm.

10. The method of claim 9,
wherein the at least one support arm comprises at least one rotatably supported substrate receptacle, and
wherein the at least one rotatably supported substrate receptacle is configured to receive and position at least one substrate.

11. The method of claim 1,
wherein the supply hose, the vacuumtight supply housing, and the first supply passage are configured in such a way that an interior of the supply hose and an interior of the vacuumtight supply housing are separated from a vacuum of an interior of the vacuum chamber.

12. The method of claim 1,
wherein the supply hose comprises at least one electric supply lead and/or at least one coolant supply line.

13. A method comprising:
coating at least one workpiece using a vacuum chamber arrangement,
wherein the vacuum chamber arrangement comprises:
a vacuum chamber comprising
a first supply passage, and
an additional first supply passage;
a substrate holding arrangement comprising
a substrate holder configured to hold and position at least one substrate, and
a vacuumtight supply housing configured to supply the substrate holder with at least one supply medium,
wherein the vacuumtight supply housing comprises a second supply passage;
an additional substrate holding arrangement comprising
an additional substrate holder configured to hold and position at least one additional substrate, and
an additional vacuumtight supply housing configured to supply the additional substrate holder with at least one supply medium,
wherein the additional vacuumtight supply housing comprises an additional second supply passage;
one or more bearings configured to support the substrate holding arrangement and the additional substrate holding arrangement within the vacuum chamber;
a supply hose configured to link the first supply passage to the second supply passage;
an additional supply hose configured to link the additional first supply passage to the second supply passage;
an electric motor configured to be at least partially in the vacuumtight supply housing to position the at least one substrate; and
an additional electric motor configured to be at least partially in the additional vacuumtight supply housing to position the at least one additional substrate,
wherein the vacuum chamber comprises a lock chamber, a heating chamber, and a coating chamber,
wherein the one or more bearings are configured to support the substrate holding arrangement in such a way that that the substrate holding arrangement can be moved, via a valve, between a first position in the lock chamber and an second position in the coating chamber,
wherein the vacuum chamber comprises an additional lock chamber and an additional heating chamber, and
wherein the one or more bearings are configured to support the additional substrate holding arrangement in such a way that that the additional substrate holding arrangement can be moved, via an additional valve, between an additional first position in the additional lock chamber and an additional second position in the coating chamber,
wherein the at least one workpiece comprises the at least one substrate and/or the at least one additional substrate.

14. The method of claim 13,
wherein the at least one motor is configured to rotate the at least one substrate.

15. The method of claim 13,
wherein coating the at least one workpiece comprises coating, at a process temperature greater than 800 degrees Celsius, the at least one workpiece with a thermal protection layer, and
wherein the thermal protection layer comprises zirconium dioxide ($ZrO_2$).

16. The method of claim 13,
wherein the vacuumtight supply housing is configured to be supplied with air or connected in a gas-transmitting manner to the environment around the vacuum chamber by the supply hose.

17. The method of claim 13,
wherein the substrate holder comprises
a first support arm being pivotably supported by a first joint of the substrate holder, and coupled to the at least one electric motor; and
wherein the substrate holder comprises
a second support arm being pivotably supported by a second joint of the substrate holder, and coupled to the at least one electric motor.

18. The method of claim 17,
wherein each of the first and second support arms comprise two rotatably supported substrate receptacles configured to receive and position two substrates,
wherein each of the two rotatably supported substrate receptacles is coupled to the at least one electric motor.

19. The method of claim 18,
wherein each of the two rotatably supported substrate receptacles is supported by a further joint,
wherein a pivoting axis of the first joint is aligned at an angle to a rotation axis of the further joint.

20. A vacuum chamber arrangement comprising:
a vacuum chamber comprising a first supply passage defining a through hole in a chamber wall of a chamber housing of the vacuum chamber, and
an additional first supply passage defining a through hole in a chamber wall of the chamber housing of the vacuum chamber;
a substrate holding arrangement comprising
a substrate holder configured to hold and position at least one substrate, and
a vacuumtight supply housing configured to supply the substrate holder with at least one supply medium,
wherein the vacuumtight supply housing comprises a second supply passage;
an additional substrate holding arrangement comprising
an additional substrate holder configured to hold and position at least one additional substrate, and
an additional vacuumtight supply housing configured to supply the additional substrate holder with at least one supply medium,
wherein the additional vacuumtight supply housing comprises an additional second supply passage;
one or more bearings configured to support the substrate holding arrangement and the additional substrate holding arrangement within the vacuum chamber;
a supply hose configured to be attached to the first supply passage and to the second supply passage; and
an additional supply hose configured to be attached to the additional first supply passage and to the additional second supply passage,
wherein the vacuum chamber comprises a lock chamber, a heating chamber, and a coating chamber,
wherein the vacuum chamber comprises a valve configured to separate the lock chamber from the heating chamber,
wherein the one or more bearings are configured to support the substrate holding arrangement in such a way that the substrate holding arrangement can be moved, via the valve, between a first position in the lock chamber and a second position in the coating chamber,
wherein the supply hose is configured in such a way that the substrate holding arrangement can be moved between the first position in the lock chamber and the second position in the coating chamber while, simultaneously, the supply hose maintains a vacuumtight attachment to the first supply passage and the second supply passage,
wherein the vacuum chamber comprises an additional lock chamber and an additional heating chamber,
wherein the vacuum chamber comprises an additional valve configured to separate the additional lock chamber from the additional heating chamber,
wherein the one or more bearings are configured to support the additional substrate holding arrangement in such a way that the additional substrate holding arrangement can be moved, via the additional valve, between an additional first position in the additional lock chamber and an additional second position in the coating chamber,
wherein the additional supply hose is configured in such a way that the additional substrate holding arrangement can be moved between the additional first position in the additional lock chamber and the additional second position in the coating chamber while, simultaneously, the additional supply hose maintains a vacuumtight attachment to the additional first supply passage and the additional second supply passage.

* * * * *